(12) United States Patent
Lee

(10) Patent No.: US 6,486,050 B1
(45) Date of Patent: Nov. 26, 2002

(54) METHOD OF MANUFACTURING III-NITRIDE SEMICONDUCTOR DEVICES

(75) Inventor: Ching-ting Lee, Tao Yuan County (TW)

(73) Assignee: Opto Tech Corporation (TW)

( * ) Notice: Subject to any disclaimer, the term of this patent is extended or adjusted under 35 U.S.C. 154(b) by 0 days.

(21) Appl. No.: 10/159,302

(22) Filed: May 31, 2002

(30) Foreign Application Priority Data

Feb. 21, 2002 (TW) ........................................ 91103084 A

(51) Int. Cl.[7] ..................... H01L 21/28; H01L 21/3205
(52) U.S. Cl. ..................... 438/602; 438/604; 438/606
(58) Field of Search ..................... 438/602, 604, 438/606, 745, 754

(56) References Cited

U.S. PATENT DOCUMENTS 5,814,533 A * 9/1998 Shakuda .................. 438/46
5,858,831 A * 1/1999 Sung ....................... 438/241
6,057,219 A * 5/2000 Cho et al. ................. 438/597
6,165,812 A * 12/2000 Ishibashi et al. .......... 438/46

* cited by examiner

Primary Examiner—Alexander Ghyka
(74) Attorney, Agent, or Firm—Martine & Penilla, LLP

(57) ABSTRACT

A method for manufacturing III-nitride semiconductor devices is disclosed. The method employs oxidation and sulfurated treatment to reduce the specific contact resistance between metal and p-type III-nitride semiconductors. The method includes surface treatment of p-type III-nitride semiconductors using $(NH_4)_2S_x$ solution to remove the native oxide from their surface; evaporating metal layer onto the surface-treated p-type III-nitride semiconductors; and then alloy processing the metals and the p-type III-nitride semiconductor with thermal alloy treatment. The method may further include a pre-oxidation step prior to the sulfurated treatment. In this way, ohmic contact can be formed between the metal layer and the p-type III-nitride semiconductors.

14 Claims, 4 Drawing Sheets

METHOD OF MANUFACTURING III-NITRIDE SEMICONDUCTOR DEVICES

BACKGROUND OF THE INVENTION

1. Field of the Invention

The present invention relates to a method of manufacturing III-nitride semiconductor devices, especially to a method of reducing the specific contact resistance between metal and p-type III-nitride semiconductor devices.

2. Description of the Related Art

Since Nichia Company of Japan disclosed the technology of forming GaN epitaxy layer on $Al_2O_3$ (sapphire) substrate, III-nitride semiconductors have become more and more important and been considered as main material of blue light-emitting diodes, laser diodes and electronic devices. Nowadays one of the key factors that affects the lifetime of light-emitting diodes, laser diodes and electronic devices is ohmic contact between metal and p-type III-nitride semiconductors. Besides, in both of electronic devices and optoelectronic devices manufacturing process, it is a basic demand to form ohmic contact with low resistance between metal and p-type III-nitride semiconductors. The conventional methods for forming low specific contact resistance between metal and p-type GaN are as follows: (1) applying diffusion technology or ion implantation technology to p-type III-nitride semiconductor manufacturing process; (2) increasing doped concentration of magnesium in growing p-type III-nitride semiconductors; (3) evaporating a metal layer whose higher work function onto p-type III-nitride semiconductor surface; (4) processing p-type III-nitride semiconductors with various types of surface treatments, such as KOH, HCl, or aqua regia treatment, etc.

However, since the carrier concentration of p-type III-nitride semiconductors cannot be raised effectively and metal whose work function higher than p-type III-nitride semiconductors is absent, the conventional methods still fail to achieve a desired low specific contact resistance between metal and p-type III-nitride semiconductors.

Therefore, a method for lowering the specific contact resistance between metal and p-type III-nitride semiconductors is urgently required.

SUMMARY OF THE INVENTION

Therefore, one object of the invention is to provide a method for forming ohmic contact between metal and p-type III-nitride semiconductors.

Another object of the invention is to provide a method for manufacturing III-nitride semiconductor devices, which has a low specific contact resistance between metal and p-type III-nitride semiconductors.

According an embodiment of the invention, the method for forming ohmic contact between metal and p-type III-nitride semiconductors includes the steps of:

- dipping samples formed with p-type III-nitride layer into ammonium sulfide solution to remove native oxide from the surface of said p-type III-nitride layer;
- cleaning and drying the samples;
- evaporating metal layer onto the surface of the p-type III-nitride layer; and
- processing the samples with thermal alloy treatment.

According to another embodiment of the invention, the method for forming ohmic contact between metal and p-type III-nitride semiconductors includes the steps of:

- performing oxidation treatment to samples formed with p-type III-nitride layer;
- dipping the samples into ammonium sulfide solution to remove oxide from the surface of said p-type III-nitride layer;
- cleaning and drying the samples;
- evaporating metal layer onto the surface of the p-type III-nitride layer; and
- processing the samples with thermal alloy treatment.

The objects, features and advantages of the present invention will become more apparent with reference to the accompanying drawings and the following detailed descriptions.

DETAIL DESCRIPTION OF THE INVENTION

As describe above, in current epitaxial process, the carrier concentration of p-type III-nitride semiconductors cannot be raised effectively and metal whose work function higher than p-type III-nitride semiconductors is absent. Therefore, the invention emphasizes on improving the surface property of p-type III-nitride semiconductors so as to make the contact between metal and p-type III-nitride semiconductors becomes better.

The inventor discovers that a thin native oxide film is formed unavoidably on the surface of p-type III-nitride semiconductors. The native oxide prohibits the forming of ohmic contact between metal and p-type III-nitride semiconductors. Therefore, the first and second embodiments of the invention will show the methods for improving the contact behavior between metal and p-type Ill-nitride semiconductors by removing the native oxide.

The invention will be described below in detail with reference to the attached drawings.

First Embodiment

Experiment process:

(a) growing a buffer layer and p-type GaN layer on a substrate with Metalorganic Chemical Vapor Deposition (MOCVD) Method or Molecular Beam epitaxial (MBE) method;

(b) forming a rectangle area of transmission line method pattern on the p-type GaN surface, including the steps of: first, evaporating Ni/Au (50/600nm) onto the p-type GaN surface to form a Ni/Au layer; transforming the Ni/Au layer into a rectangle mask; dry etching the GaN layer with a reactive ion etching system; then dipping the samples into aqua regia solution to remove the Ni/Au mask;

(c) cutting the samples into two pieces and dipping each piece into the following chemicals respectively: trichloro ethylene, acetone and methanol, each chemical for 5 minutes;

(d) cleaning these two pieces with deionized water for 5 minutes, and then blowing dry with a nitrogen gun;

(e) defining one of these two pieces which has no further treatment as sample A;

(f) dipping another piece into $(NH)_4S$. solution at 60° C. for 30 minutes (hereinafter, the process refers to "sulfurated treatment"); cleaning the piece with deionized water again and blowing dry with the nitrogen gun; then defining the piece as sample B;

(g) forming photoresist layer on samples A and B with patterns desired to be evaporated to form metal electrodes by utilizing exposure and development technology; then, evaporating Ni/Au (20/100nm) onto samples A and B with an electron beam evaporator;

(h) measuring the electric properties of samples A and B with a semiconductor parameter analyzer (HP 4145B);

(i) placing samples A and B into a rapid thermal annealing (RTA) system and performing thermal treatment at 500° C. for 10 minutes (hereinafter, the process refers to "thermal alloy treatment"); then, measuring the current-voltage properties of samples A and B with the semiconductor parameter analyzer;

(j) inspecting the p-type GaN surface of samples A and B with an X-ray photoelectron spectroscopy (XPS).

Figure 1:
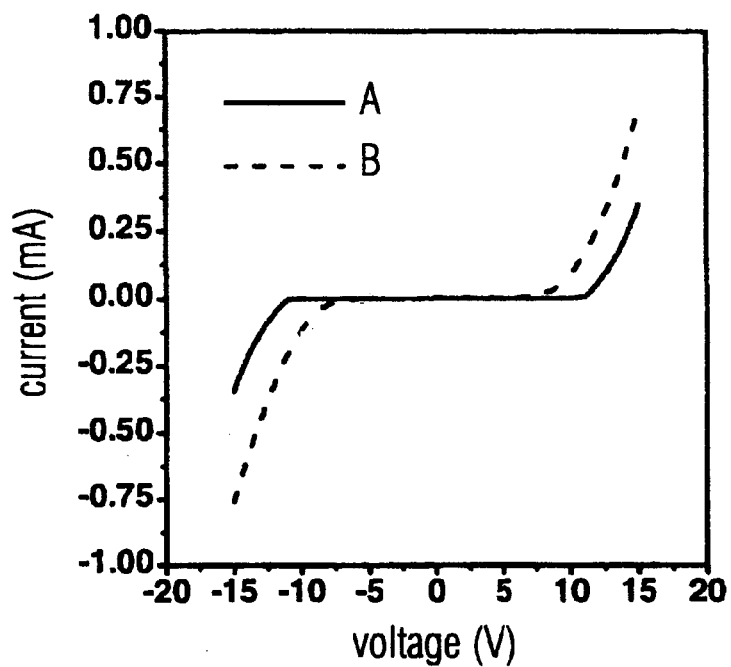
FIG. 1 shows the electric properties of samples A and B after evaporating with Ni/Au.

Results:

FIG. 1 shows the electric properties of GaN samples A and B after evaporating with Ni/Au. Although both of these two samples shows rectification property, sample B has better electric property and a smaller turn-on voltage; while sample A has worse electric property and a higher turn-on voltage. Obviously, after the sulfurated treatment, the native oxide is removed from the surface of sample B. Therefore, sample B has better metal-semiconductor contact than sample A.

Figure 2:
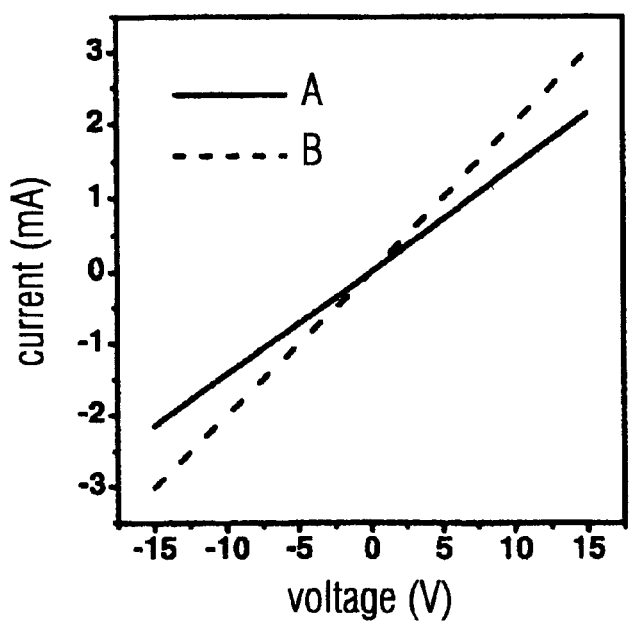
FIG. 2 shows the electric properties of samples A and B after the thermal alloy treatment.
Figure 3:
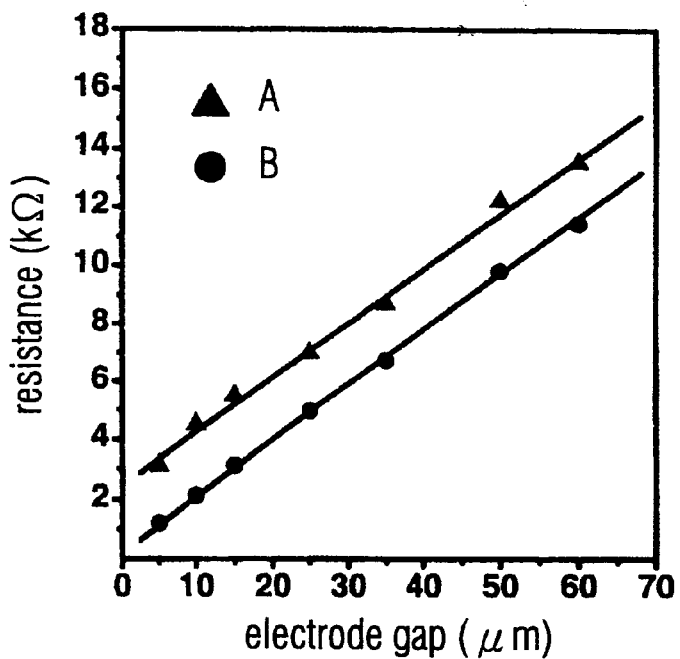
FIG. 3 shows the relationship between the electrode gaps and the resistance of samples A and B after thermal alloy treatment.

FIG.2 shows the electric properties of samples A and B after the thermal alloy treatment. As shown in the figure, the electric properties of these two samples both show ohmic contact behavior. Thus, the specific contact resistance of sample A and B can be calculated by using the transmission line method. The specific contact resistance of sample A and B is $6.1+10^{31}\ ^3m^2$ and $5.0+10^{31}\ ^5m^2$, respectively see FIG. 3. Obviously, sample B, which is process with the sulfurated treatment, has smaller specific contact resistance than sample A, which has no surface sulfurated treatment.

Figure 4:
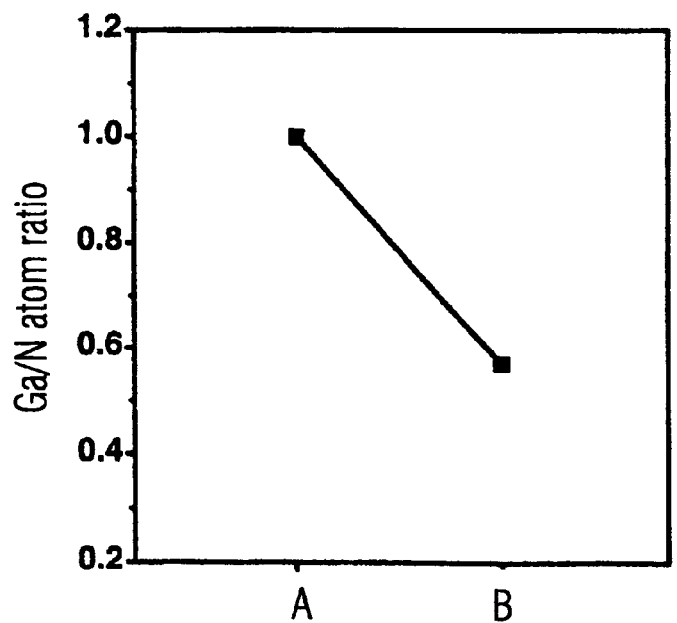
FIG. 4 shows the Ga/N atom ratio on the surface of samples A and B before evaporating with metal.

FIG.4 shows the inspection results of samples A and B before evaporating with metal by utilizing X-ray photoelectron spectroscopy. As shown in the figure, if the Ga/N atom ratio on the surface of sample A is set to 1, the Ga/N atom ratio on the surface of sample B will be 0.57. This result shows that sample B with sulfurated treatment has a lower Ga/N atom ratio. That is, more Ga vacancies are formed on the surface of sample B. The more Ga vacancies represent that the p-type GaN surface of sample B has a higher hole concentration.

Therefore, according to the above experiment results, the native oxide on the p-type GaN substrate can be removed with sulfurated treatment technology, so as to have a lower turn-on voltage after evaporating with metal. Moreover, after removing the native oxide, there is more Ga vacancies formed on the p-type GaN surface and the induced hole concentration thereof is increased. As a result, a better ohmic contact with metal can be performed.

Although samples A and B are evaporated with Ni/Au in step (g), they also can be evaporated with Ni/Au, Pt/Au, Pt, Pd, Pd/Ni, Nb/Au or Ni/ITO in practice. Meanwhile, the temperature of thermal alloy treatment in step (i) can be performed at 200° C. to 800° C.

Second Embodiment

Experiment process:

(a) growing a buffer layer and p-type GaN layer on a substrate with Metalorganic Chemical Vapor Deposition Method or Molecular Beam epitaxial method;

(b) forming a rectangle area of transmission line method pattern on the p-type GaN surface, including the steps of: first, evaporating Ni/Au (50/600nm) onto the GaN surface to form a Ni/Au layer; transforming the Ni/Au layer into a rectangle mask; dry etching the GaN layer with a reactive ion etching system; then dipping the samples into aqua regia solution to remove the Ni/Au mask;

(c) cutting the samples into two pieces and dipping each piece into the following chemicals respectively: trichloro ethylene, acetone and methanol, each chemical for 5 minutes;

(d) cleaning these two pieces with deionized water for 5 minutes, and then blowing dry with a nitrogen gun;

(e) defining one of these two pieces which has no further treatment as sample A;

(f) placing another piece into a rapid thermal annealing system to perform thermal treatment at 750° C. under air environment for 30 minutes (hereinafter, the process refers to "oxidation treatment" ); next, dipping this piece into $(NH)_4S$, solution at 60° C. for 30 minutes (hereinafter, the process refers to "sulfurated treatment"); then, cleaning the piece with deionized water again and blowing dry with the nitrogen gun and defining the piece as sample C;

(g) forming photoresist layer on samples A and C with patterns desired to be evaporated to form metal electrodes by utilizing exposure and development technology; then, evaporating Ni/Au (20/100nm) onto samples A and C with an electronic beam evaporator;

(h) measuring the electric properties of samples A and C using a semiconductor parameter analyzer (HP 4145B)

(i) placing these two samples into a rapid thermal annealing system and performing thermal treatment at 500° C. under air environment for 10 minutes (hereinafter, the process refers to "Thermal alloy treatment"); then, measuring the current-voltage properties of samples A and B using a semiconductor parameter analyzer;

(j) inspecting the p-type GaN surface of samples A and C with an X-ray photoelectron spectroscopy (XPS).

Figure 5:
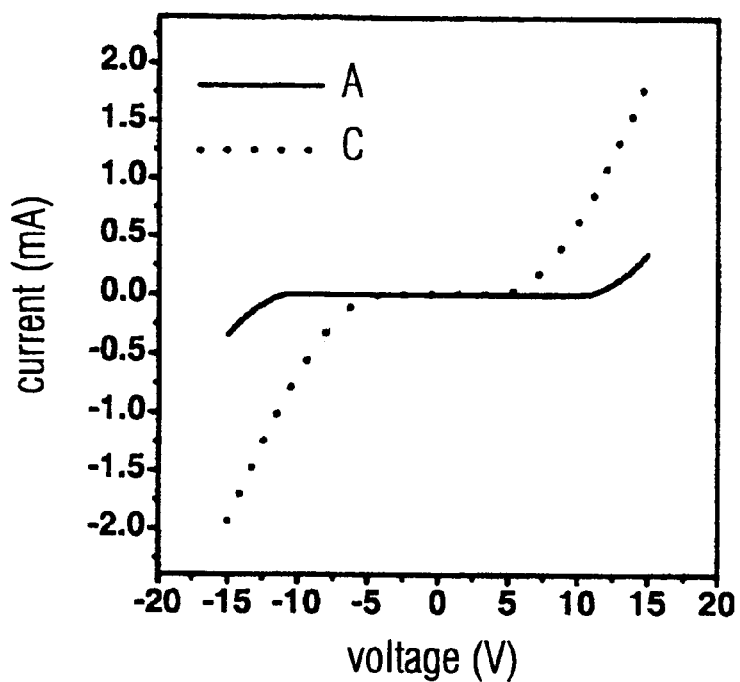
FIG. 5 shows the electric properties of samples A and C after evaporating with Ni/Au.

Results:

FIG. 5 shows the electric properties of samples A and C after evaporating with Ni/Au. Although both of these two samples shows rectification property, sample C has better electric property and a smaller turn-on voltage, while sample A has worse electric property and a higher turn-on voltage. Obviously, after oxidation and sulfidation treatments, the native oxide is removed from the surface of sample C. Therefore, sample C has better metal-semiconductor contact than sample A.

Although the oxidation treatment to sample C before the sulfurated treatment is performed at 750° C. under air environment, it also can be performed at 300° C. to 1000° C. under oxygen contained environment. Similarly, though samples A and C are evaporated with Ni/Au in step (g), they also can be evaporated with Ni/Au, Pt/Au, Pt, Pd, Pd/Ni, Nb/Au or Ni/ITO in practice.

Figure 6:
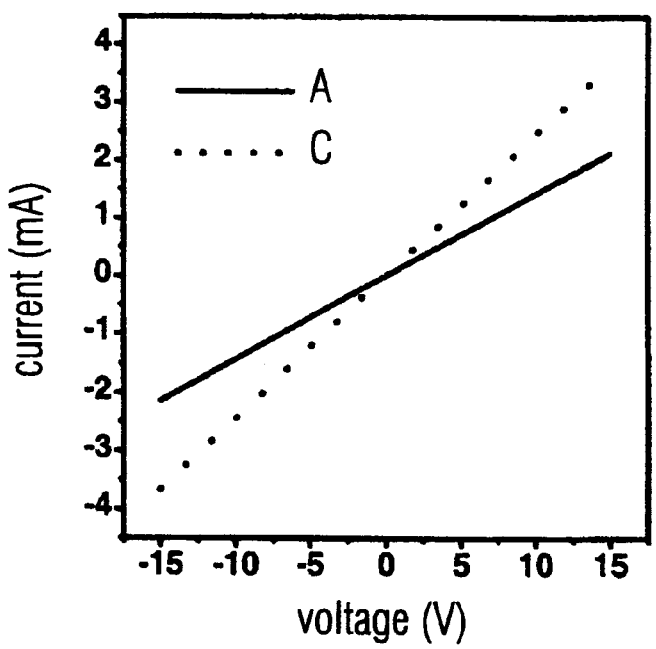
FIG. 6 shows the electric properties of samples A and C after the thermal alloy treatment.
Figure 7:
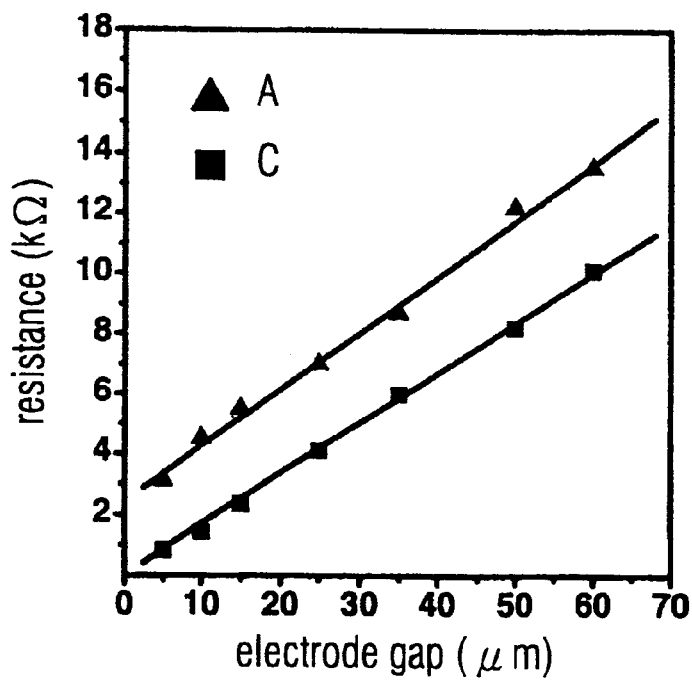
FIG. 7 shows the relationship between the electrode gaps and the resistance of samples A and C after the thermal alloy treatment.

FIG. 6 shows the electric properties of samples A and C after thermal alloy treatment. As shown in the figure, the electric properties of these two samples both show ohmic contact behavior. Thus, the specific contact resistance of sample A and C can be calculated by using the transmission line method. The specific contact resistance of sample A and C is $6.1 \times 10^{-3} m^2$ and $4.5 \times 10^{-6} m^2$, respectively, see FIG. 7. Obviously, sample C, which is process with the sulfurated treatment, has smaller specific contact resistance than sample A, which has no surface sulfurated treatment. Meanwhile, as comparing with sample B of the first embodiment, the specific contact resistance of sample C is also smaller than that of sample B.

Although the thermal alloy treatment in step (i) is performed at 500° C., it also can be performed at 200° C. to 800° C.

Figure 8:
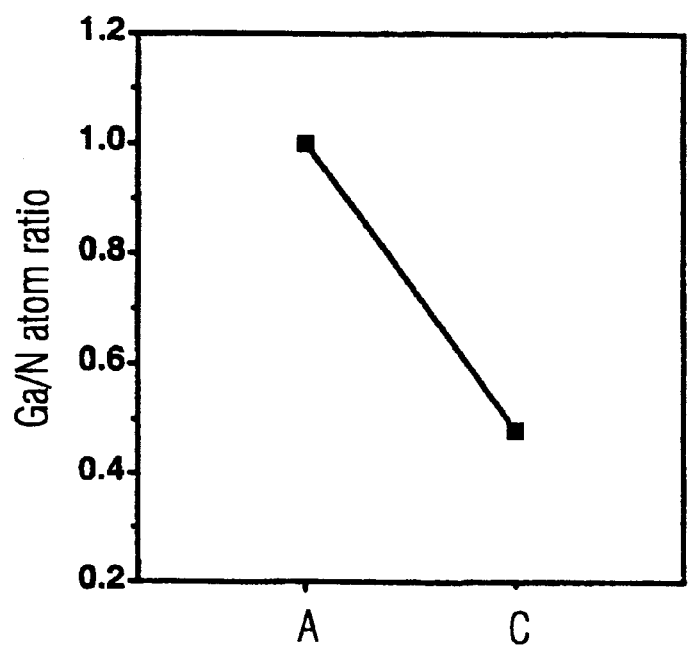
FIG. 8 shows the Ga/N atom ratio on the surface of samples A and C before evaporating with metal.

FIG. 8 shows the inspection results of samples A and C before evaporating with metal by utilizing an X-ray photoelectron spectroscopy. As shown in the figure, if the Ga/N atom ratio on the surface of sample A is set to 1, the Ga/N atom ratio on the surface of sample C will be 0.48. As comparing with the first embodiment, the Ga/N atom ratio of sample C is also lower than that of sample B.

This result comes from the fact that more gallium oxide, i.e., $GaO_x$, is formed on the GaN surface of sample C after the oxidation treatment. Therefore, more Ga vacancies are formed on the surface of sample C after removing the oxide layer with $(NH_4)_2S_x$ solution. The Ga vacancies have the property of donors, and can increase the induced hole concentration on the p-type GaN surface dramatically. As a result, the specific contact resistance thereof is reduced.

As described above, the native oxide on the p-type GaN surface can be removed with sulfurated treatment, so as to have a smaller turn-on voltage after evaporating with metal. Moreover, by placing the p-type GaN into the rapid thermal annealing system at 750° C. under air environment for 30 minutes to perform thermal treatment prior to sulfurated treatment, the turn-on voltage thereof becomes even smaller. Since more gallium oxide is formed on the p-type GaN surface in the pre-oxidation step, more Ga vacancies are formed after removing the oxide layer. Hence, the induced hole concentration on the p-type GaN surface of is increased.

In addition, by placing the p-type GaN samples evaporated with metal into the rapid thermal annealing system at 500° C. under air environment for 10 minutes to perform thermal alloy treatment, ohmic contact is formed between the metal layer and the p-type GaN. In this process, the pre-oxidized samples still have smaller specific contact resistance;

While preferred embodiments of the present invention have been described above, such description is for illustrative purposes only, and it is to be understood that changes and variations may be made without departing from the spirit or scope of the following claims.

What is claimed is:

1. A method for forming ohmic contact between metal layer and p-type III-nitride layer, comprising the steps of:
   dipping samples formed with p-type III-nitride layer into ammonium sulfide solution to remove native oxide from the surface of said p-type III-nitride layer;
   cleaning and drying said samples;
   evaporating metal layer onto the surface of said p-type III-nitride layer; and
   processing said samples with thermal alloy treatment.

2. The method of claim 1, wherein said metal layer is selected from the group consisted of Ni/Au, Pt/Au, Pt, Pd, Pd/Ni, Nb/Au, and Ni/ITO.

3. The method of claim 1, wherein the temperature of said thermal alloy treatment is in the range of 200° C. to 800° C.

4. A method for forming ohmic contact between metal layer and p-type III-nitride layer, comprising the steps of:
   performing oxidation treatment to samples formed with p-type III-nitride layer;
   dipping said samples into ammonium sulfide solution to remove oxide from the surface of said p-type III-nitride layer;
   cleaning and drying said samples;
   evaporating metal layer onto the surface of said p-type III-nitride layer; and
   processing said samples with thermal alloy treatment.

5. The method of claim 4, wherein said metal layer is selected from the group consisted of Ni/Au, Pt/Au, Pt, Pd, Pd/Ni, Nb/Au, and Ni/ITO.

6. The method of claim 4, wherein the temperature of said oxidation treatment is in the range of 300° C. to 1000° C.

7. The method of claim 4, wherein the temperature of said thermal alloy treatment is in the range of 200° C. to 800° C.

8. A method for manufacturing Group III-nitride semiconductor devices, comprising the steps of:
   growing devices's structures which include p-type III-nitride layer on a substrate; dipping said samples into ammonium sulfide solution to remove native oxide from the surface of said p-type III-nitride layer;
   cleaning and drying said samples;
   evaporating metal layer onto the surface of said p-type III-nitride layer; and
   processing said samples with thermal alloy treatment.

9. The method of claim 8, wherein said metal layer is selected from the group consisted of Ni/Au, Pt/Au, Pt, Pd, Pd/Ni, Nb/Au, and Ni/ITO.

10. The method of claim 8, wherein the temperature of said thermal alloy treatment is in the range of 200° C. to 800° C.

11. A method for manufacturing Group III-nitride semiconductor devices, comprising the steps of:
    growing devices's structures which include p-type III-nitride layer on a substrate; performing oxidation treatment to said samples;
    dipping said samples into ammonium sulfide solution to remove oxide from the surface of said p-type III-nitride layer;
    cleaning and drying said samples;
    evaporating metal layer onto the surface of said p-type III-nitride layer; and
    processing said samples with thermal alloy treatment.

12. The method of claim 11, wherein said metal layer is selected from the group consisted of Ni/Au; Pt/Au, Pt, Pd, Pd/Ni, Nb/Au, and Ni/ITO.

13. The method of claim 11, wherein the temperature of said oxidation treatment is in the range of 300° C. to 1000° C.

14. The method of claim 11, wherein the temperature of said thermal alloy treatment is in the range of 200° C. to 800° C.

* * * * *